(12) United States Patent
Sechrist et al.

(10) Patent No.: US 9,910,200 B1
(45) Date of Patent: Mar. 6, 2018

(54) INCREASED VISIBLE AND INFRARED TRANSMISSION THROUGH RADIO FREQUENCY EMI SHIELDS

(71) Applicant: The United States of America as represented by the Secretary of the Navy, Washington, DC (US)

(72) Inventors: Zachary Sechrist, Ridgecrest, CA (US); Donald Bowling, Ridgecrest, CA (US); Denise Canadas, Ridgecrest, CA (US); Pamela Overfelt, Moraga, CA (US)

(73) Assignee: The United States of America as Represented by the Secretary of the United States, Washington, DC (US)

( * ) Notice: Subject to any disclaimer, the term of this patent is extended or adjusted under 35 U.S.C. 154(b) by 38 days.

(21) Appl. No.: 14/703,971

(22) Filed: May 5, 2015

Related U.S. Application Data

(60) Provisional application No. 61/988,625, filed on May 5, 2014.

(51) Int. Cl.
    *G02B 1/10*      (2015.01)
    *G02B 5/28*      (2006.01)
    *G02B 26/00*     (2006.01)

(52) U.S. Cl.
    CPC ............. *G02B 5/286* (2013.01); *G02B 5/282* (2013.01); *G02B 26/001* (2013.01)

(58) Field of Classification Search
    CPC ........ G02B 26/001; G02B 6/26; G02B 5/208; G02B 5/0816
    USPC ............... 359/584, 585, 245, 360; 313/479; 257/40
    See application file for complete search history.

(56) References Cited

U.S. PATENT DOCUMENTS

| | | | | |
|---|---|---|---|---|
| 6,021,001 A * | 2/2000 | Turner | ............... | G02B 5/289 359/585 |
| 7,196,835 B2 * | 3/2007 | Peumans | ............. | H01L 51/5265 359/245 |
| 7,199,927 B2 * | 4/2007 | Uehara | ................. | G02B 5/284 359/260 |
| 7,407,896 B2 * | 8/2008 | Negro | .................... | B82Y 10/00 257/E21.268 |
| 8,158,450 B1 * | 4/2012 | Sheats | ............... | H01L 31/02245 136/259 |
| 2011/0096391 A1 * | 4/2011 | Kanai | ................... | F24J 2/1057 359/360 |
| 2013/0292655 A1 * | 11/2013 | Becker | ................ | C23C 14/024 257/40 |

OTHER PUBLICATIONS

Bernin, et al. Induced transmission in absorbing films applied to band pass filter design. J. of the Optical Soc. of Amer., vol. 47, No. 3, 1957,p. 230-239.

Singh, et al. Capping layers for extreeme-UV multilayer interference coatings, Optic Letters, Mar. 1, 2001, vol. 26, No. 5 p. 259-261.

Suman, et al. Aperiodic multilayers with enhanced reflectivity for extreme UV lithography, Applied Optics, vol. 47, No. 16 Jun. 1, 2008, p. 2906-2914.

* cited by examiner

*Primary Examiner* — Audrey Y Chang
(74) *Attorney, Agent, or Firm* — Charlene A. Haley

(57) ABSTRACT

An invention generally relating to minimizing performance loss of the system when fitted with an electromagnetic interference (EMI) shield.

17 Claims, 9 Drawing Sheets

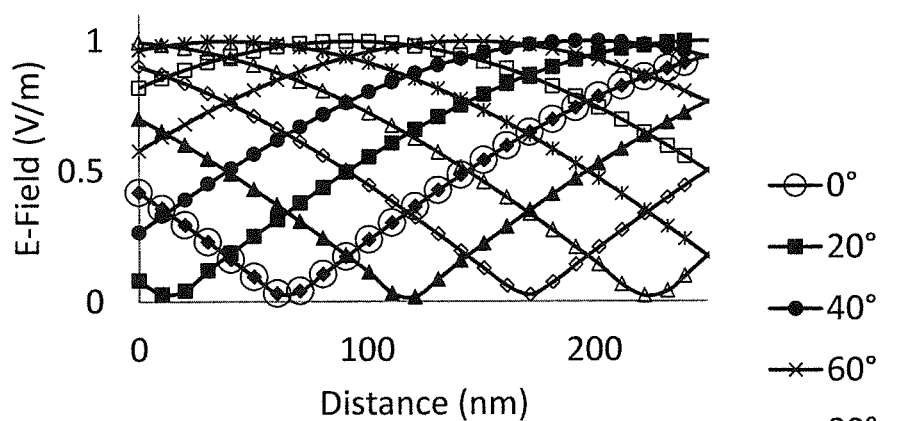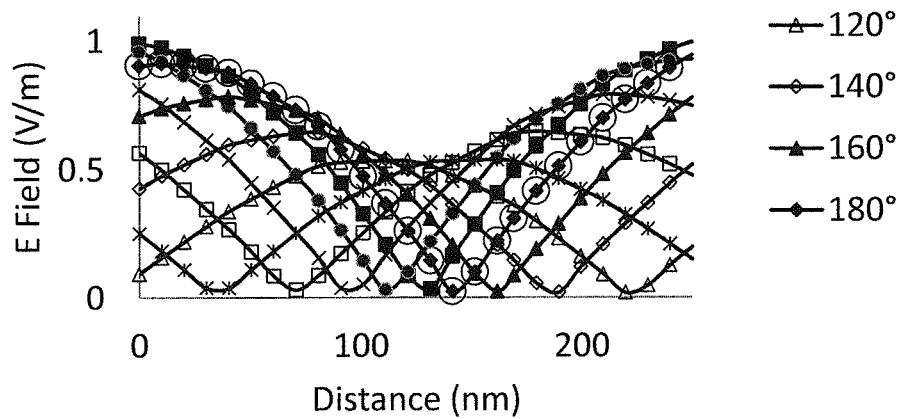
Figures 2a & b

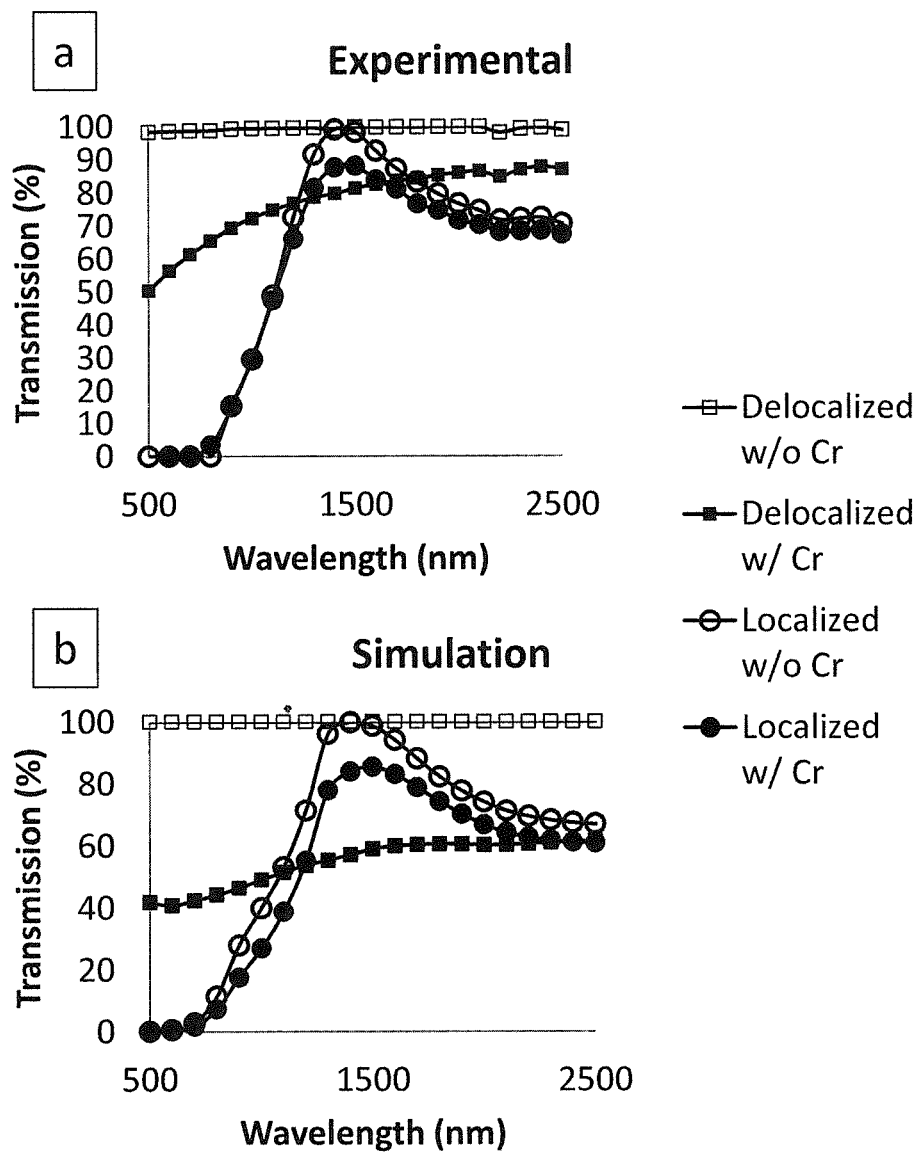
Figures 3a & b

| String number | Fibonacci Sequence |
|---|---|
| 0 | Ge |
| 1 | Ge/MgF2 |
| 2 | Ge/MgF2/Ge |
| 3 | Ge/MgF2/Ge/Ge/MgF2 |
| 4 | Ge/MgF2/Ge/Ge/MgF2/Ge/MgF2/Ge |
| 5 | Ge/MgF2/Ge/Ge/MgF2/Ge/MgF2/Ge/Ge/MgF2/Ge/MgF2 |

8b

| String number | Thue-Morse Sequence |
|---|---|
| 0 | Ge |
| 1 | Ge/MgF2 |
| 2 | Ge/MgF2/MgF2/Ge |
| 3 | Ge/MgF2/MgF2/Ge/MgF2/Ge/Ge/ MgF2 |
| 4 | Ge/MgF2/MgF2/Ge/MgF2/Ge/Ge/ MgF2/MgF2/Ge/Ge/MgF2/Ge/MgF2/MgF2/Ge |

8c

| String number | Cantor Sequence |
|---|---|
| 0 | Ge |
| 1 | Ge/MgF2/Ge |
| 2 | Ge/MgF2/Ge/MgF2/MgF2/MgF2/Ge/MgF2/Ge |
| 3 | Ge/MgF2/Ge/MgF2/MgF2/MgF2/Ge/MgF2/Ge/MgF2/MgF2/MgF2/MgF2/MgF2/MgF2/MgF2/MgF2/MgF2/Ge/MgF2/Ge/MgF2/MgF2/MgF2/Ge/MgF2/Ge |

| String number | Periodic Sequence |
|---|---|
| 0 | Ge |
| 1 | Ge/MgF2 |
| 2 | Ge/MgF2/Ge |
| 3 | Ge/MgF2/Ge/MgF2 |
| 4 | Ge/MgF2/Ge/MgF2/Ge |
| 5 | Ge/MgF2/Ge/MgF2/Ge/MgF2 |

9b

| String number | Rudin-Shapiro Sequence |
|---|---|
| 0 | Ge |
| 1 | Ge/Ge |
| 2 | Ge/Ge/Ge/MgF2 |
| 3 | Ge/Ge/Ge/MgF2/Ge/Ge/MgF2/Ge |
| 4 | Ge/Ge/Ge/MgF2/Ge/Ge/MgF2/Ge/Ge/Ge/MgF2/MgF2/MgF2/Ge/MgF2 |

FIGURES 9a-b

INCREASED VISIBLE AND INFRARED TRANSMISSION THROUGH RADIO FREQUENCY EMI SHIELDS

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

PROVISIONAL APPLICATION STATEMENT

This is a provisional application filed in accordance with 35 U.S.C. 111(b).

FIELD OF THE INVENTION

The invention generally relates to minimizing performance loss of the system when fitted with an electromagnetic interference (EMI) shield.

BRIEF DESCRIPTION OF THE DRAWINGS

FIGS. 2a & b are graphs showing the electric field intensity as a function of position for multiple input phase angles in a delocalized electric field optic (2a) and a localized electric field optic (2b). The wavelength of light is 1430 nm, which corresponds to a PTR of the localized wave structure, according to embodiments of the invention.

FIGS. 3a & b are graphs showing the experimental (3a), and theoretical (3b), transmission measured for a 16 layer Ge/MgF2 aperiodic stack without (solid line) and with (dashed line) 5 nm of chromium inserted into the stack between layers 8 and 9, according to embodiments of the invention.

FIGS. 8a-c and 9a-b are examples of differing sequencing of the order of the string numbers, according to embodiments of the invention.

Figure 1:
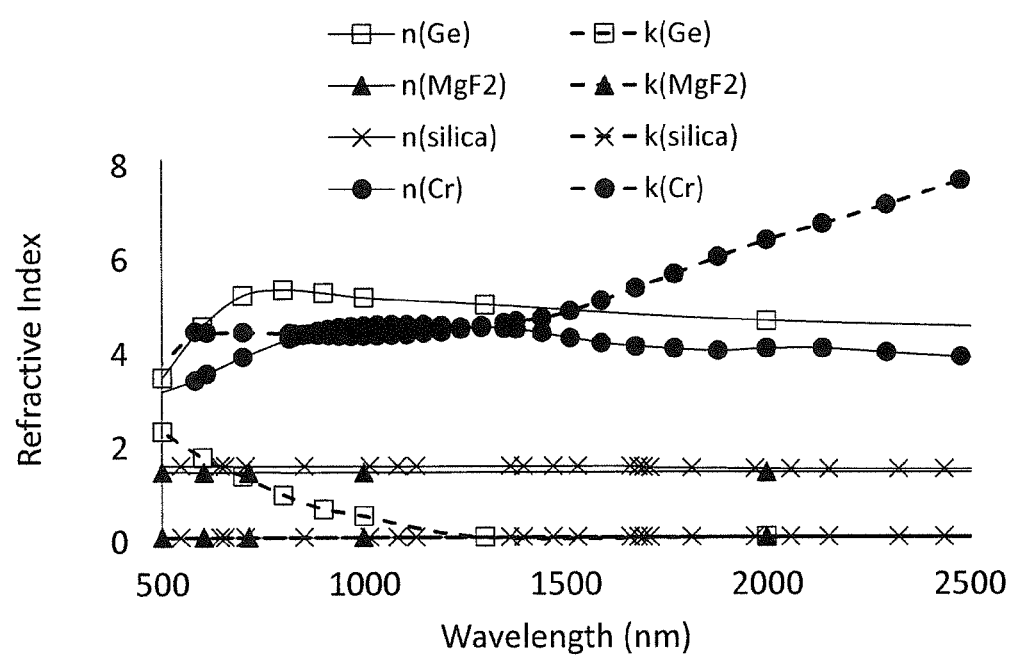
FIG. 1 is a graph showing the real (n) and imaginary (k) components of the refractive index for thin films modeled in this study, according to embodiments of the invention.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

The invention generally relates to minimizing performance loss of the system when fitted with an electromagnetic interference (EMI) shield.

Visible and infrared cameras are susceptible to electromagnetic interference (EMI). The window/dome through which the camera operates suffers a transmission loss when fitted with a preventative EMI shield. The technology herein will minimize performance loss of the system when fitted with an EMI shield. Solutions to transmission loss through EMI shields have been explored previously through design and materials research on the shields. This novel approach modifies the transmitted wave around the shield instead of modifying the shield itself.

The multilayer stack described herein is composed of thin films of at least two materials with different refractive indices. As light passes through the multilayer, each interface between dissimilar materials transmits some of the light and reflects some of the light. The reflected and transmitted light interferes with one another both constructively and destructively. In the regions where waves interact constructively, a high electric field intensity region is created. In the regions where waves interact destructively, a low electric field intensity region is created. These structures can be assembled such that the net forward scattered light through the multilayer stack gives 100% transmission. It is the 100% transmitting structures that are of utilized in this invention to maximize window performance.

Typical free space radiation consists of both electric and magnetic fields, but light interacts with most materials predominantly with the electric field. Therefore, this invention minimizes interaction (i.e. transmission absorbance) by minimizing the electric field strength around the absorber. Embodiments of the invention include the insertion of an absorber into the low electric field intensity region of the 100% transmitting multilayer stack to minimize transmission loss from the absorber. The application addressed would be the case of the absorber being an EMI shield.

We have theoretically and experimentally investigated deterministic aperiodic multilayer thin film stacks capable of spatially localizing a low electric field region around an absorbing layer. This low electric field decreases the loss generated by the absorber relative to an identical absorber in a delocalized electric field optic. When no absorber is placed in the multilayer stack, the symmetric aperiodic multilayer used to localize the electric field generates a broad and stable transmission peak due to a perfect transmission resonance effect. This structure is compared to both traditional traveling wave windows that expose the absorber to a delocalized electric field and periodic multilayers that can also produce electric field localization. Such multilayer coatings would be useful in window and dome applications, which often use lossy electromagnetic interference (EMI) shields to protect sensitive visible and infrared sensors.

Due to the prolific growth of radio frequency (RF) devices in modern society (cellular phones, Wi•Fi devices, global positioning systems, radar towers, household electronics, handheld radios, radio frequency identification (RFID) systems, etc.) the world that we live in is saturated with sources of electromagnetic interference (EMI). Operating sensitive visible and infrared (IR) cameras in the presence of EMI can lead to deleterious effects. EMI induced degradation is the driving force for integrating an EMI shield with visible/IR sensor windows. These EMI shields are designed to block RF radiation and transmit visible/IR radiation. There are two popular forms of EMI shields: metallic grids and transparent conductive oxides (TCO). Both systems generate some transmission loss. This transmission loss is proportional to the square of the electric field intensity absorbed/scattered by the EMI shield. Metallic grids receive attention for mid-wave infrared applications because the open lattice allows these wavelengths to transmit, but metallic grids can lose a significant fraction of transmitted light due to diffraction [M. Kohin, S. J. Wein, J. D. Traylor, R. C. Chase and J. E. Chapman, "Analysis and design of transparent conductive coatings and filters," *Optical Engineering*, 32 (5), 911 (1993).]. The amount of light lost due to diffraction increases as the intensity of the electric field increases. Recent research on the implementation of metallic grids bas investigated minimizing diffraction loss, but was focused on grid design to maximize infrared performance [J. I. Halman, K. A. Ramsey, M. Thomas and A. Griffin, "Predicted and measured transmission and diffraction by a metallic mesh coating," *Proc. of SPIE Window and Dome Technologies and Materials XI*, 7302, 73020Y (2009); I. B. Murray, V. Densmore, V. Bora, M. W. Pieratt, D. L. Hibbard and T. D. Milster, "Numerical comparison of grid pattern diffraction effects through measurement and modeling with Optiscan software," *Proc. of SPIE: Windows and Dome Technology and Materials XII*, 8016, 80160U (2011)]

At visible wavelengths, TCO films have been the preferred solution due to their good transparency. However, TCO films exhibit high absorption in the mid-wave infrared due to a molecular absorption of the electric field components of the transmitted light [T. Hitosugi, N. Yamada, S. Nakao, Y. Hirose and T. Hasegawa, "Properties of TiO2-based transparent conducting oxides," *Physica Status Solidi A*, 207 (7), 1529 (2010)]. This loss in TCO shields also increases with increasing electric field intensity. Since the loss mechanism for both metallic grid and TCO systems is tied to the electric field strength at the absorber, it stands to reason that minimizing the electric field intensity around an EMI shield will minimize the transmission loss caused by the EMI shield. This study will capitalize on the interference of transmitted and reflected waves generated in a multilayer film structure to create regions of high electric field intensity from the constructive interference and regions of low electric field intensity from the destructive interference. An EMI shield will be inserted into the depressed electric field region generated by destructive interference to minimize the transmission loss generated by the shield. These novel multilayer windows will be compared to a more traditional window (homogenous fused silica). The traditional window is devoid of the localized high or low electric field regions generated by the constructive and destructive interference. These non-interfering structures will be referred to as delocalized electric field structures throughout this paper.

Optical wave localization was first envisioned in 1984 [S. John, "Electromagnetic absorption in a diordered medium near a photon mobility edge," *Physical Review Letters*, 53 (22), 2169 (1984)], and led to an explosion of research in the field of optics. Shortly after the theory of light localization was introduced, the first study of light localization in aperiodic structures was published [M. Kohmoto, B. Sutherland and K. Iguchi, "Localization in optics: quasiperiodic media," *Physical Review Letters*, 58 (23), 2436 (1987)]. The aperiodic structures garnered additional interest because they not only displayed electric field localization, but they also produced multiple perfect transmission resonance (PTR) peaks when stacked symmetrically [X. Huang, Y. Wang and C. Gong, "Numerical investigation of light-wave localization in optical Fibonacci superlattices with symmetric internal structure," *Journal of Physics: Condensed Matter*, 11 (39), 7645 (1999)]. The PTR may occur in structures without symmetry, but the symmetric aperiodic structures always display PTR. Perfect transmission was not the only advantage for aperiodic multilayer use. Aperiodic structures can localize optical waves using fewer layers [S. Mookherjea, J. S. Park, S. Yang and P. R. Bandaru, "Localization in silicon nanophotonic slow-light waveguides," *Nature Photonics*, 2, 90 (2008)] and are more tolerant of layer thickness fluctuations [R. Riklund and M. Severin, "Optical properties of perfect and non-perfect quasi-periodic mulilayers: a comparison with periodic and disordered multilayers," *Journal of Physics C: Solid State Physics*, 21, 3217, (1988)]. The aperiodic stacks have also been noted for spectral features with superior angular bandwidth compared to periodic systems [Z. S. Wang, H. C. Wang, J. T. Zhu, F. L. Wang, Z. X. Gu, L. Y. Chen, A. G. Michette, A. K. Powell, S. J. Pfauntsch and F. Schafers, "Broad angular multilayer analyzer for soft X-rays," *Optics Express*, 14 (6), 2533 (2006)], and for larger spectral bandwidth [A. Wonisch, T. Westerwalbeloh, W. Hachmann, N. Kabachnik, U. Kleineberg and U. Heinzmann, "Aperioidic nanometer multilayer systems as optical key components for attosecond electron spectroscopy," *Thin Solid Films*, 464-465, 473 (2004)]. No examples of enhanced transmission through subwavelength lossy media utilizing electric field engineering could be found in literature searches, but similar schemes have been adopted for reflection and absorption applications. Localization in one dimensional aperiodic structures have been explored previously for minimizing mirror reflection loss caused by the environmentally inert capping layer on an EUV mirror [M. Singh and J. J. Braat, "Capping layers for extreme-ultraviolet multilayer interference coatings," *Optics Letters*, 26 (5), 259 (2001); M. Suman, M. G. Pelizzo, P. Nicolosi and D. L. Windt, "Aperiodic multilayers with enhanced reflectivity for extreme ultraviolet lithography," *Applied Optics*, 47 (16), 2906 (2008)].

Additionally, electric field interference structures have been used to maximize the absorption and efficiency of photovoltaic devices [M. Agrawal and P. Peumans, "Broadband optical absorption enhancement through coherent light trapping in thin-film photovoltaic cells," *Optics Express*, 16 (8), 5385 (2008)]. This will be the first example, to the authors' best knowledge, of enveloping an absorber into a PTR structure with the goal of minimizing the transmission loss.

Multilayer Construct. The Fibonacci sequence was utilized to produce deterministic aperiodicity within the multilayer stacks. Fibonacci multilayers follow a stacking pattern in which the Nth string in the sequence obeys the familiar Fibonacci recurrence relation: $F_N = F_{N-1} + F_{N-2}$. The first two elements need to be defined as particular thin film materials ($F_0$=magnesium fluoride and $F_1$=germanium), and then the multilayer film sequence can be calculated. To produce a symmetric aperiodic structure suitable for perfect transmission resonance, two Fibonacci sequence multilayer stacks were placed together in a mirrored image configuration. The resulting symmetric aperiodic thin film sequence for combining two 5th string Fibonacci multilayers of germanium and magnesium fluoride are shown in Table 1. Table 1. Thin film sequence and thickness in symmetric 16 layer aperiodic multilayer based on 51th string of a Fibonacci sequence.

| Layer Number | Material | Thickness (nm) |
|---|---|---|
| — | Fused Silica | ∞ |
| 1 | Germanium | 7.8 |
| 2 | Magnesium Fluoride | 29.1 |
| 3 | Germanium | 7.8 |
| 4 | Magnesium Fluoride | 29.1 |
| 5 | Germanium | 7.8 |
| 6 | Germanium | 7.8 |
| 7 | Magnesium Fluoride | 29.1 |
| 8 | Germanium | 7.8 |
| * | Chromium | 0 or 5 nm |
| 9 | Germanium | 7.8 |
| 10 | Magnesium Fluoride | 29.1 |
| 11 | Germanium | 7. |
| 12 | Germanium | 7.8 |
| 13 | Magnesium Fluoride | 29. |
| 14 | Germanium | 7.8 |
| 15 | Magnesium Fluoride | 29.1 |
| 16 | Germanium | 7.8 |
| — | Fused Silica | ∞ |

The electric field distribution within the multilayer stack was calculated using both Ansoft's Designer and High Frequency Structural Simulator (HFSS) software packages. The Designer software uses lumped and distributed components analyzed and synthesized using network and matrix solution techniques. HFSS is a commercially available full wave electromagnetic solver utilizing finite element techniques. Transmission and reflection magnitudes were generated using Essential Macleod thin film modeling software. Essential Macleod is a ray tracing program that allowed iterative design parameters to be modified quickly for performance optimization. The optical constants used to describe the constituent materials in the multilayer were collected from the thin film modeling software, and are in reasonable agreement with literature [E. D. Palik, *Handbook of Optical Constants II*, San Diego, Calif.: (Academic Press, 1991)]. The optical constants for germanium (Ge), magnesium fluoride (MgF2), chromium (Cr), and fused silica (SiQ) are all shown in FIG. 1. The solid lines represent the real part of the dielectric constant, and the dashed lines represent the imaginary components for each film. Theoretically, the chromium and germanium are the only materials with loss (nonzero imaginary component of the refractive index) in the wavelength range shown, and only chromium would generate loss between $\lambda$=1400 nm-2500 nm. The imaginary components for magnesium fluoride {k(MgF2)} and silica {k(silica)} both have zero values throughout the range of wavelengths investigated.

FIG. 1. Real (n) and imaginary (k) components of the refractive index for thin films modeled in this study. Germanium and magnesium fluoride were chosen due to the dramatic difference in the real parts of the refractive index between the two materials. The phenomenon being exploited herein is the interference of forward and back scattered light to produce spatially localized high and low intensity electric field regions. The index contrast between these two transparent materials allows the interface between the materials to more efficiently scatter the incident light [J. D. Joannopoulos, R. D. Meade and J. N. Winn, *Photonic Crystals: Molding the Flow of Light*, Princeton, N.J. (Princeton University Press, 1995)]. The materials chosen were the most significantly contrasted index materials available for experimental verification using thermal evaporation deposition techniques. Chromium was chosen as an ersatz absorbing material because of the low cost, good adherence, and strong absorption across the wavelength region of interest. More functional EMI shields such as TCOs and metallic grids suffer from complex dispersion, difficult reproducibility, and in the case of grids. Difficult lithography and large computational expense for modeling near-infrared performance. Chromium can produce a transmission loss proportional to the film thickness that was tuned to match the significant loss that may be experienced with a traditional EMI shields.

Fabrication and Characterization. Thin films were thermally evaporated in a NEXDEP chamber from Angstrom Engineering using 99.999% pure germanium from Afla Aesar Inc. and 99.9% pure magnesium fluoride from Sigma Aldrich Inc. Fused silica samples, from Technical Glass Products Inc., were used as substrates. Chromium was deposited using ebeam evaporation in the same chamber with 99.98% chromium from Afla Aesar Inc. Transmission measurements were collected with a Perkin Elmer Lambda 950 with the incident light normal to the fused silica surfaces. Experimental transmission data are normalized, using a sample without chromium, to 100% at the point of highest transmission to isolate the change attributed to the chromium insertion.

The electric field distribution as a function of position within the optic was modeled using HFSS. The electric field distributions for both delocalized and localized electric field systems are shown in FIGS. 2a and b respectively. The multilayer stack used to localize the wave in FIG. 2b is the thin film design of Table 1 without an absorber in the system (0 nm Cr). Multiple phase angles of the incident radiation at the input port of the unit cell are examined, and a clear phase angle independent electric field intensity depression becomes apparent at the center of the multilayer stack. Alternatively, the electric field distribution inside a uniform window is shown in FIG. 2a as an example of a delocalized electric field system. The location of electric field maxima and minima sweep through the delocalized electric field structure as a function of phase angle, making the time averaged electric field intensity at all points in the structure a constant value (the average sine wave intensity incident on the uniform window). FIG. 2 electric field intensity as a function of position for multiple input phase angles in a delocalized electric field optic (2a) and a localized electric field optic (2b). The wavelength of light is 1430 nm, which corresponds to a PTR of the localized wave structure.

It can be seen in FIG. 3b that electric field depression exists at the center of the symmetric 16 layer stack. The average electric field intensity is 46% lower in the middle of the localized system compared to the delocalized electric field system. For this study, the center of the aperiodic system is the region into which the absorber is inserted. The center position had the added benefit of being a convenient insertion point experimentally, and the electric field distribution was not significantly perturbed by the insertion of an absorber at this location.

The experimental and theoretical spectra for identical chromium films deposited in a delocalized electric field structure (fused silica windows) and in a localized electric field structure (Ge/MgF2 aperiodic stacks deposited on fused silica substrates) are shown in FIGS. 3a and b. The open symbols represent an optical system without the chromium absorber, while the solid fill symbols are the same system with a lossy 5 nm chromium layer inserted. Good agreement between the position and shape of the transmission peak suggests that the optical thicknesses used in the model were correct.

It can be seen that the experimental and theoretical spectra for the aperiodic systems show a smaller peak transmission change as a function of chromium insertion compared to the delocalized electric field case. The reduced transmission change shows that the PTR structure around the chromium absorber decreased the loss generated by the chromium. The smaller bandwidth of enhanced transmission seen in experimental data compared to theoretical predictions is attributed to absorptions caused by defects in the evaporated germanium and magnesium fluoride thin films. Such loss would not be expected in fully crystalline materials, and was amplified by the slow wave behavior seen in electric field localizing optical structures [J. A. Scales, L. D. Can, D. B. McIntosh, V. Freilikher and Y. P. Bliokh, "Millimeter wave localization: slow light and enhanced absorption," *Physical Review B*, 76, 085118 (2007)].

FIG. 3a. Experimental (3a), and theoretical (3b), transmission measured for a 16 layer Ge/MgF2 aperiodic stack without (solid line) and with (dashed line) 5 nm of chromium inserted into the stack between layers 8 and 9. The transmission change caused by chromium insertion in simulations is stronger than the change observed experimentally. At the PTR resonance ($\lambda$=1430 nm) the experimental data shows a decrease in transmission of 100% to 88% in the localized electric field structure, and 100% to 81% in the delocalized electric field structure. Simulation data shows chromium insertion to decrease transmission 100% to 85% in the localized electric field structure, and 100% to 56% delocalized electric field structure. The experimental film was a mere 5 nm thick according to quartz crystal microbalance measurements. The weaker experimental transition was attributed to the thinness of the chromium because such thin films often contain voids which decrease conductivity, and decrease absorptivity [U. K. Chettiar, P. Nyga, M. D. Thoreson, A. V. Kildishev, V. P. Drachev and V. M. Shalaev, "FDTD modeling of realistic semicontinuous metal films," *Applied Physics B*, 100, 159 (2010)].

Figure 4:
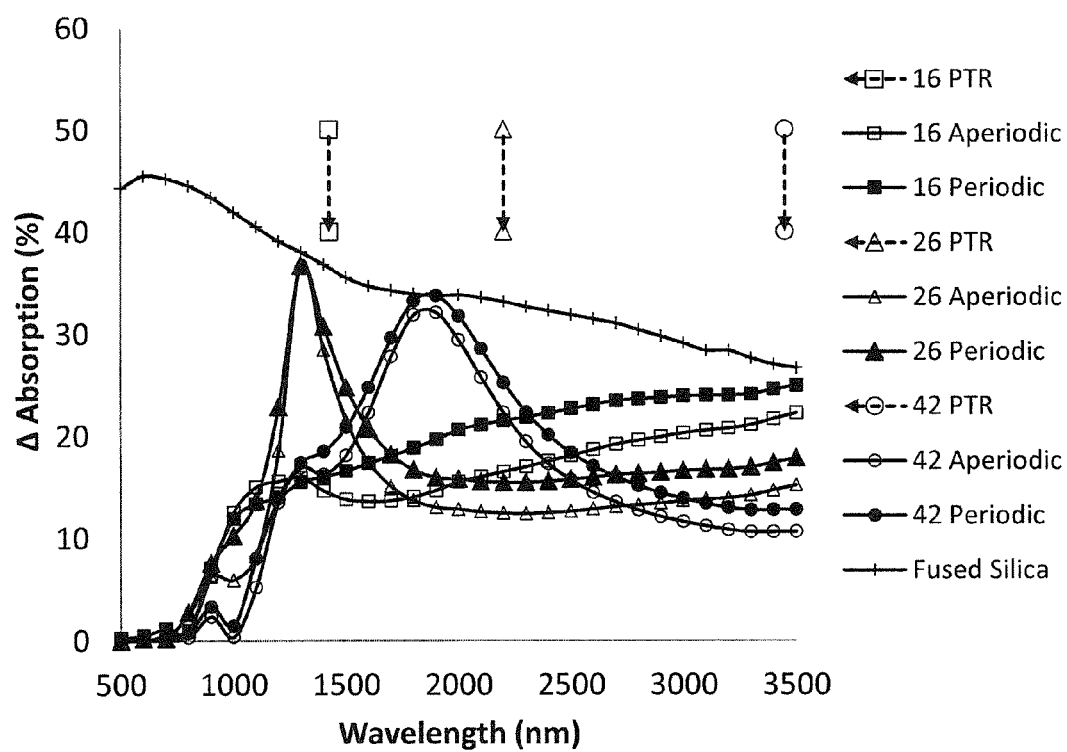
FIG. 4 is a graph showing the change in absorption generated by the insertion of a 5 nm chromium film in both asymmetric periodic and symmetric aperiodic structures with 16, 26, and 42 individual Ge/MgF2 layers. Continuous lines represent simulated spectra. Open symbols are aperiodic systems and solid fill symbols are periodic systems. The dashed arrows indicate the position of PTR for each aperiodic multilayer system, according to embodiments of the invention.

FIG. 4 shows the theoretical absorption difference spectra for both periodic and aperiodic structures. The absorption for each sample is calculated as 100% minus transmission minus reflection. The difference spectra presented in FIG. 4 are the magnitude of the absorption from a sample without chromium minus the absorption from a sample with 5 nm of chromium, i.e. the change in absorption when chromium is added to the system. The number of layers within the Ge/MgF$_2$ multilayer structure was varied from 16 to 26 to 42 layers. The film thicknesses within all of the structures were held constant: germanium=7.8 nm and magnesium fluoride=29.1 nm. FIG. 4. Change in absorption generated by the insertion of a 5 nm chromium film in both asymmetric periodic and symmetric aperiodic structures with 16, 26, and 42 individual Ge/MgF2 layers. Dotted and dashed lines are spectra, while solid vertical lines show the wavelength of PTR for the structures.

The sequence of layers (periodic vs. aperiodic) did not significantly vary the position or bandwidth of strong transmission, but the transmission resonance wavelength position did vary as a function of the number of layers in the stack. Increasing the number of layers, and therefore the total stack height, red-shifts the PTR resonance. The wavelength of the perfect transmission peak within each system is identified in FIG. 4 with a dashed line of the same symbol as the periodic and aperiodic absorption difference spectra. The square symbols represent a multilayer with 16 Ge/MgF$_2$ layers, and had a PRT resonance at $\lambda$=1430 nm. The triangle symbols represent a multilayer with 26 Ge/MgF$_2$ layers, and had a PRT resonance at $\lambda$=2200 nm. The circle symbols represent a multilayer with 42 Ge/MgF$_2$ layers, and had a PRT resonance at $\lambda$=3450 nm. The solid line with crosses represents the change in absorption seen for 2 fused silica windows without any multilayer, i.e. the delocalized electric field system. The solid fill symbols are periodic structures of alternating Ge/MgF$_2$ layers, and the open symbols are aperiodic structures of Ge/MgF$_2$ layers that follow the $5^{th}$(16 layers), $6^{th}$ (26 layers), and $7^{th}$(42 layer) strings of the Fibonacci sequence. Both the periodic and aperiodic structures reduced the absorption that could be generated by the introduction of a 5 nm chromium film compared to insertion into a traditional delocalized electric field optic. The Fibonacci sequence stacks experienced a reduced loss (lower delta absorption) in comparison with the periodic systems. This can be attributed to aperiodic stacks generating lower average electric field intensity across the space that would be filled with the absorbing chromium film.

Performance trends as a function of number of layers were not identified by the data presented here. Increasing the number of layers will increase the aperiodicity [R. W. Peng, X. Q. Huang, F. Qui, M. Wang, A. Hu, S. S. Jiang and M. Mazzer, "Symmetry-induced perfect transmission of light waves in quasiperiodic dielectric multilayers," *Applied Physics Letters*, 80, 3063 (2002)], giving rise to increased number PTR frequencies with decreased bandwidths. No preferential behavior as a function of the number of layers was observed within the limited sample space explored herein.

Figure 5:
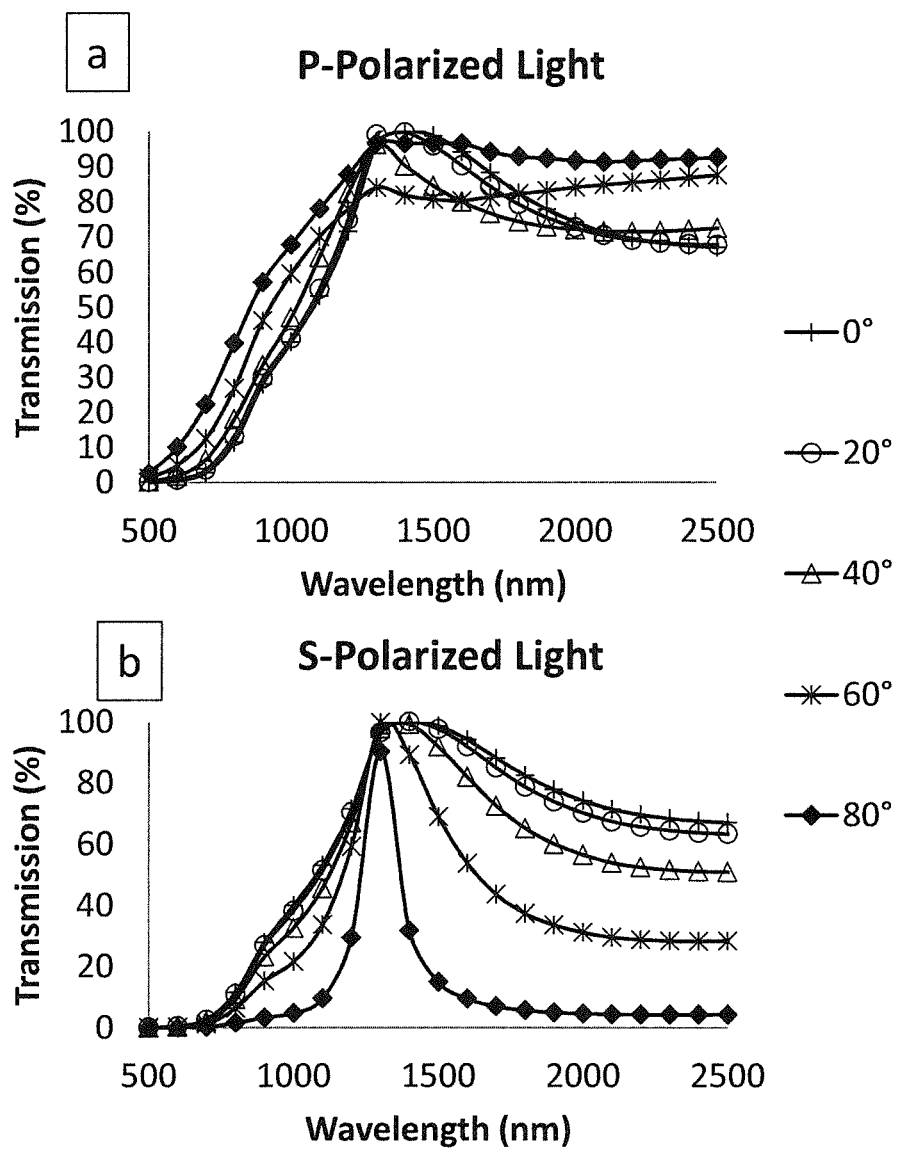
FIGS. 5a & b are graphs showing the theoretical transmission through 16 layer symmetric Ge/Mgf2 multilayer at varying incident angles for P-polarized (5a) and S-polarized (5b) radiation, according to embodiments of the invention.

All of the data presented so far was collected at a normal incidence to the multilayer stack, but the performance of the structures at off-normal incidence is of great concern in the field of windows and domes. The transmission through the 16 layer aperiodic structure without an absorber at various angles is shown in FIGS. 5a and b. FIG. 6a shows the P-polarized light transmission and 6b shows the S-polarized behavior. FIG. 5. Theoretical transmission through 16 layer symmetric Ge/Mgf2 multilayer at varying incident angles for P-polarized (5a) and S-polarized (5b) radiation.

In this study zero degrees incident angle is normal to the multilayer surface, and 80 degrees is near grazing. At a 30 degree incident angle both S and P polarized light show a departure from normal incidence behavior for the 16 layer Fibonacci stack. Periodic structures are not shown, but display the same behavior. Germanium absorption within the multilayer at wavelengths below 1400 nm (See FIG. 1) diminishes the intensity of the transmission peak of the stacks, reducing the transmission full wave half maximum as the increased incident angle produces a blue shift in peak transmission.

A thin film of chromium was used in experimental and theoretical investigations within this study to eliminate the necessity of a complex 3D model needed for a metal grid pattern and the highly variable optical constants of a potential TCO. While optical loss of a thin metal film may mimic the loss that would be generated by an EMI shield, the thickness of these traditional shields can be much larger than the thin chromium film. To understand the loss behavior expected from thicker absorbing layers with identical loss as the thin chromium film, absorber films were generated with variable thicknesses. FIGS. 6a and b shows the absolute absorption from a stack with varied absorber thicknesses.

Figure 6:
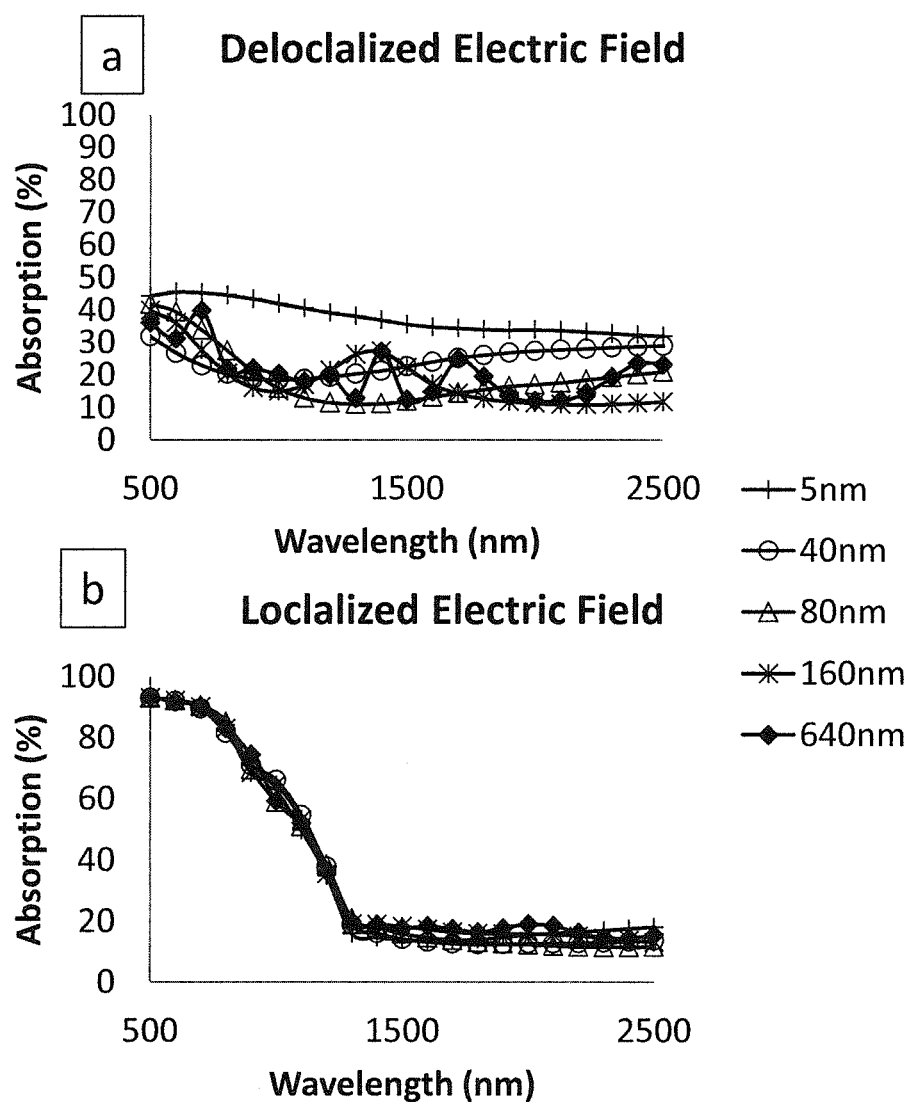
FIGS. 6a & b are graphs showing the absorption seen in both traditional delocalized electric field optics (6a) and localized electric field optics (6b) as a function of absorber thickness, according to embodiments of the invention.
Figure 7:
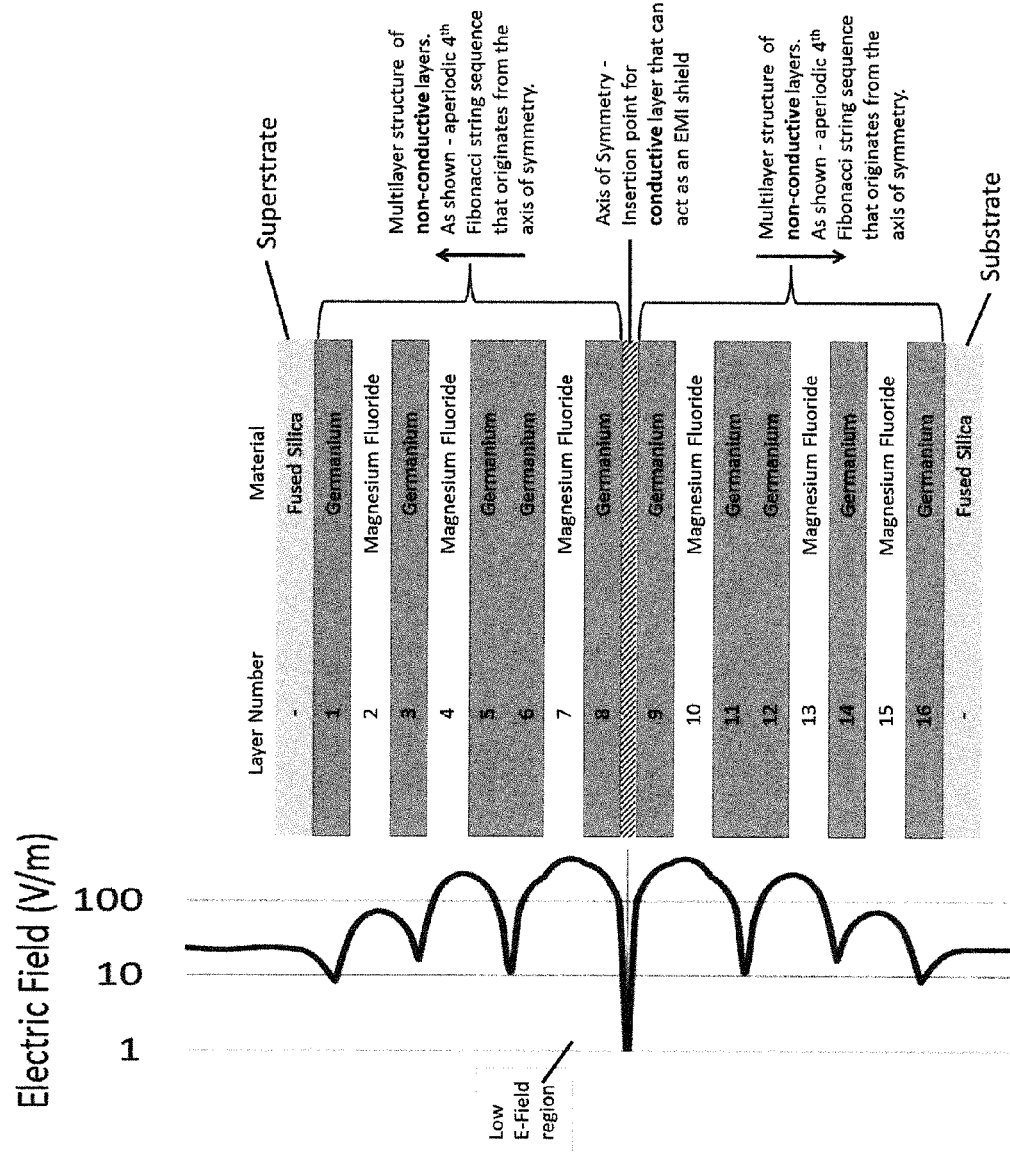
FIG. 7 is a graph showing electric field amplitude as a function of position in a perfect transmission resonance structure composed of two mirrored 8 layer aperiodic stacks, according to embodiments of the invention.

FIG. 6. Absorption seen in both traditional delocalized electric field optics (6a) and localized electric field optics (6b) as a function of absorber thickness. Each absorber has the same real part of the refractive index as the chromium, but had the imaginary component scaled down inversely proportional to the thickness of the layer. FIG. 6a shows the absorption generated by introducing an absorber between two fused silica windows, i.e. delocalized electric field structure. FIG. 6b shows the absorption generated by introducing an absorber into a 16 layer aperiodic structure, i.e. localized electric field structure. The absorber in the aperiodic stack absorbs less than the delocalized electric field system within the transparent region of the multilayer ($\lambda$>1400 nm). Reduced absorption within the aperiodic stack is attributed to the lower electric field strength around the absorber, but it should be noted that this reduced absorption is only useful for windows and domes in the high transmission wavelength region of the Ge/MgF$_2$ structure (See FIG. 3).

The fused silica delocalized electric field sample demonstrates significant interference effects as a function of absorber thickness, which is largely muted within the aperiodic system. The reduced interference fringing within the aperiodic system can be attributed to the reduced electric field intensity within the absorber layer due to electric field localization. Because the electric field wave intensity is minimized in the absorber by the aperiodic structure enveloping the absorber, interference fringes generated within this region make a minimal contribution to the total transmission through the system. The aperiodic stack system displays reasonably stable absorption with reduced magnitude compared to the window system without a multilayer.

Theoretical and experimental evidence has been presented that demonstrates transmission loss through subwavelength absorbers can be minimized utilizing electric field spatial engineering. Electric field spatial localization was achieved using periodic and aperiodic structures theoretically, and the aperiodic structures provided better performance. At the wavelength of highest transmission, we experimentally observed only a 12% decrease in transmission for a chromium absorber enveloped within an aperiodic stack compared to a 19% decrease in transmission for a traditional window. This behavior was theoretically determined to be stable for incident angles up to 30 degrees off normal, and for absorber thicknesses up to 640 nm in a 16 layer symmetric aperiodic multilayer using a Fibonacci sequence. Ideas developed herein were focused on EMI shields for windows and domes, but could be extended to other more prevalent commercial products such as lossy transparent top layers in photovoltaic devices or touch screen electronics.

Simulation work using both ray tracing and finite element methods have been employed to study the optical system described herein. Both periodic and aperiodic multilayer films have been utilized to localize the electric field around an absorber. The deterministic aperiodic system used a Fibonacci sequence, but could have also used the Thue-Morse, Cantor, or any other non-periodic sequence to localize the light. The multilayer composed of magnesium fluoride and germanium layers, but could have utilized any number of other transparent materials in the wavelength region of interest: silicon dioxide, aluminum oxide, titanium oxide, silicon, silicon nitride, yitria oxide, diamond, aluminum oxynitride, borosilicate glass, cellophane, cellulose acetate germanium dioxide, nitrocellulose, poly methyl methacrylate, poly carbonate, polyethelyene, polyethylene teraphthalate, polyactic acid, FR4, Duroid, polydimethyl siloxane, polyvinyl butyral, pyrex, sodalime glass, and this list is not exhaustive.

The EMI shield used in this demonstration was chromium, but could have been an inorganic transparent conducting oxide, a transparent conducting organic film, or a random, deterministic aperiodic, or periodic conducting mesh using gold, silver, platinum, palladium, copper, doped semiconductor, conducting polymer, or any other conductive material. Both simulations and experiments demonstrate higher transmission through an absorber when it is placed in the low electric field intensity region of the multilayer compared to an identical absorber placed in a traditional traveling wave window. The enhanced transmission, i.e. minimized absorption, is only seen in the wavelength region which experiences very high transmission through the multilayer stack. The wavelength location and bandwidth are determined by the sequence, materials, and number of layers in the multilayer. This structure has been optimized for near infrared wavelengths (1500 nm), but could be tuned to be useful for x-ray, ultraviolet, visible, infrared, terahertz, microwave, and radio frequency applications.

Transmission loss through the visible/infrared sensor window limits the spatial range in which the sensor can operate. For this reason window and dome materials are chosen that have vanishingly small loss tangents. Unfortunately, the very low loss window materials are not suitable to block unwanted electromagnetic radiation that can disrupt or destroy sensitive camera electronics. To shield the camera from EMI, a lossy conductive shield is added to the window. The shield necessarily absorbs some transmitted light, therefore decreasing the camera performance. Embodiments of the invention are a multilayer coating that localizes the incident electric field into spatial regions of high and low electric field intensity. These localized regions do not move with time, and can be large enough to envelope an EMI shield. When the shield is placed in a region of low electric field intensity, the interaction between the shield and incident wave is minimized. This decreased interaction between light and the absorber (EMI shield) decreases the transmission loss, effectively increasing the range of the visible/infrared system relative to an EMI shield protected system without the multilayer coating.

No prior examples of static electric field tuning could be found for the application of transmission absorber mitigation, but prior art has explored reflection enhancement from an absorbing surface and enhanced absorption in a photovoltaic device. Localization in one dimensional aperiodic structures have been explored previously for minimizing mirror reflection loss caused by the environmentally inert capping layer on an EUV mirror (M. Singh and J. J. Braat. "Capping layers for extreme-ultraviolet multilayer interference coatings." Optics Letters. vol. 26. no. 5. p. 259. 2001; M. Suman. M. G. Pelizzo. P. Nicolosi and D. L. Windt. "Aperiodic multi layers with enhanced reflectivity for extreme ultraviolet lithography." Applied Optics. vol. 47. no. 16. p. 2906-2008). Additionally, electric field interference structures have been used to maximize absorption and efficiency of photovoltaic devices (M. Agrawal and P. Peumans. "Broadband optical absorption enhancement through coherent light trapping in thin-film photovoltaic cells." Optics Express, vol. 16. no. 8. p. 5385-2008)

A multilayered apparatus utilizing electric field spatial engineer and/or reducing transmission loss including, plurality of non-conductive layers having at least one first material and at least one second material with different refractive indices, where the change in refractive indices between the different materials is greater than about 0.2 ($\Delta n \geq 0.2$), where the non-conductive layers are dimensioned and configured to form at least one aperiodic or periodic structure/sequence that create interference of forward and back scattering light to produce spatially localized higher and lower intensity electric field regions, and at least one conductive component, where the non-conductive layers are assembled and formed in association with the conductive component, where the conductive component is positioned in the lower intensity electric field region such that the net forward scattered light gives substantially reduced transmission loss.

Another aspect of embodiments of the invention generally relate to films or coatings including, a plurality of non-conductive layers form a multilayer stack having at least one first material and at least one second material with different refractive indices, where the change in refractive indices between the different materials is a ratio greater than about 0.2 where the non-conductive layers are dimensioned and configured to form at least one aperiodic or periodic structure/sequence that create interference of forward and back scattering light to produce spatially localized higher and lower intensity electric field regions, and at least one conductive component, where the non-conductive layers are assembled and formed in association with the conductive component, where the conductive component is positioned in the lower intensity electric field region such that the net forward scattered light gives substantially reduced transmission loss.

In embodiments, the one first material with higher refractive indices are selected from the group consisting of substantially metal oxides, metal nitrides, metal fluorides, and semiconductors with a refractive index higher 1.45 and an extinction coefficient less than 0.01. (Conductive equals non zero loss tangent equals non zero extinction coefficient). In embodiments, the one second material with lower refractive indices are selected from the group consisting of substantially metal oxides, metal nitrides, metal fluorides and semiconductors with a refractive index less than 1.45 and an extinction coefficient less than 0.01. In embodiments, the non-conductive layers are aperiodic, the non-conductive layers are configured and dimension based on a multilayer stack formation selected from the group consisting of, but not limited to, Fibonacci Sequence, Thue-Morse Sequence, Rudin-Shapiro Sequence, random sequence, and Cantor Sequence. In embodiments, the non-conductive layers are dimensioned and configured to be symmetrically formed around or on the conductive component in a mirrored multilayer formation. In embodiments, the non-conductive layers are in the form of a film or coating.

In embodiments, the conductive layers are selected from the group consisting of, but not limited to, substantially pure chromium wires or films, indium tin oxide (ITO), copper wires or films, silver wires or films, tungsten wires or films, gold wires or films, platinum wires or films, palladium wires or films, titanium wires or films, cadmium oxide wires or films, fluorine doped tin oxide wires or films, titanium nitride wires or films, doped zinc oxide wires or films, doped germanium wires or films, doped silicon wires or films, and other conductive oxides, dope semiconductors, nitrides and metals, and any combination thereof. In embodiments, the thickness of each non-conductive layer in a multilayer stack is dependent on a wavelength of light that will be transmitted through the apparatus such that the minimum optical thickness of each film or coating is greater than or equal to the minimum wavelength experiencing enhanced transmission divided by 50. In embodiments, the total thickness of a multilayer stack is dependent on the optical thickness of each layer used and the number of layers, where the number of layers following the aperiodic sequence is a minimum of 10.

In embodiments, the non-conductive layers are in intimate contact with all or a portion of the conductive component. In embodiments, the non-conductive layer is uniformly associated with the conductive component. In embodiments, the multilayer stack includes alternating layers of first materials with higher refractive indices and second materials with higher refractive indices. Embodiments further include at least one substrate. The substrate can be any suitable substrate that can hold the film or coating including, but not limited to glass. Embodiments further include at least one substrate, where the multilayer stack has an outermost and innermost layer, where at least one substrate is the outermost layer and/or at least one substrate is the inner most layer. In embodiments, the multilayer stack includes alternating layer of substantially pure magnesium fluoride and substantially pure germanium. In embodiments, the multilayer stacks are dimensioned and configured to position the higher and lower intensity electric field regions depending on desired electric field distribution as a function of position with an optic model.

In embodiments, at least one first material and at least one second material with different refractive indices are crystalline. In embodiments, the multilayer stack includes alternating layers of first materials with higher refractive indices and second materials with higher refractive indices, where the first materials with higher refractive indices are multilayered within the multilayer stack and/or second materials with higher refractive indices are multilayered with the multilayer stack. In embodiments, the film(s) or coating(s) is uniformly constructed or layered onto the conductive component or formed separately and adhesively applied to the conductive component. In embodiments, the film(s) or coating(s) is selected from the group consisting of, but not limited to, EMI shields, batteries, lens, windows, domes, photovoltaic devices, touchscreen monitors, plasmonic devices, metasurfaces, or frequency selective surfaces. In embodiments, the apparatus is selected from the group consisting of, but not limited to, EMI shields, batteries, lens, windows, domes, photovoltaic devices, touchscreen monitors, plasmonic devices, metasurfaces, or frequency selective surfaces.

Prophetic Examples

The prophetic examples are for illustration purposes only and not to be used to limit any of the embodiments.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A multilayered structure for reducing transmission loss, comprising:
    a plurality of non-conductive layers having at least one first material layer with a refractive index and constant layer thickness and at least one second material layer with different refractive index and different constant layer thickness, wherein said change in refractive indices between said different materials is greater than about 0.2, wherein said non-conductive layers are aperiodic structure/sequence that create interference of forward and back scattering light incident on the structure to produce spatially localized higher and lower intensity electric field regions; and
    at least one conductive component, wherein said non-conductive layers are assembled and formed in association with said conductive component, wherein said conductive component is positioned in said lower intensity electric field region such that the transmitted light is subjected to reduced absorption compared to a transmitted light through an identical conductive component without a multilayered structure, wherein said conductive component provides an EMI shielding function for a group consisting of lenses, windows, and domes.

2. The structure according to claim 1, wherein said one first material with higher refractive indices are selected from the group consisting of substantially metal oxides, metal nitrides, metal fluorides and semiconductors with a refractive index higher than 1.4 and an extinction coefficient less than 0.01.

3. The structure according to claim 1, wherein said one second material with lower refractive indices are selected from the group consisting of substantially metal oxides, metal nitrides, metal fluorides and semiconductors with a refractive index less than 1.5 and an extinction coefficient less than 0.01.

4. The structure according to claim 1, wherein said non-conductive layers are aperiodic, said non-conductive layers of the multilayer stack are arranged in Fibonacci Sequence.

5. The structure according to claim 1, wherein said non-conductive layers are in the form of a film or coating of optical thickness less than one wavelength at the transmission band of interest.

6. The structure according to claim 1, wherein said conductive component are metals which comprises substantially pure chromium wires or films, copper wires or films, silver wires or films, aluminum wires or films, tungsten wires or films, gold wires or films, platinum wires or films, palladium wires or films, titanium wires or films, and any combination thereof.

7. The structure according to claim 1, wherein a total thickness of a multilayer stack is dependent on the optical thickness of each said layer used and the number of layers, wherein the number of said layers following said aperiodic sequence is a minimum of 10.

8. The structure according to claim 1, wherein said non-conductive layers are in contact with all or a portion of said conductive component.

9. The structure according to claim 1, wherein said conductive layers are conductive oxides which comprises indium tin oxide (ITO), cadmium oxide wires or films, and any combination thereof.

10. The structure according to claim 1, wherein said conductive layers are doped semiconductors which comprises doped tin oxide wires or films, doped zinc oxide wires or films, doped germanium wires or films, doped silicon wires or films, and any combination thereof.

11. The structure according to claim 1, wherein said conductive layers are nitrides which comprises titanium nitride wires or films.

12. A film or coating, comprising:
    a plurality of non-conductive layers form a multilayer stack having at least one first material layer with a refractive index and constant layer thickness and at least one second material layer with different refractive index and different constant layer thickness, wherein said change in refractive indices between said different materials is a ratio greater than about 0.2 wherein said non-conductive layers are aperiodic structure/sequence that create interference of forward and back scattering light incident on the structure to produce spatially localized higher and lower intensity electric field regions; and
    at least one conductive component, wherein said non-conductive layers are assembled and formed in association with said conductive component, wherein said conductive component is positioned in said lower intensity electric field region such that the net forward scattered light gives substantially reduced transmission loss, wherein said conductive component provides an EMI shielding function for a group consisting of lenses, windows, and domes.

13. The film or coating according to claim 12, wherein said multilayer stack comprises alternating layers of first materials with higher refractive indices and second materials with lower refractive indices.

14. The film or coating according to claim 13, further comprising at least one substrate.

15. The film or coating according to claim 13, further comprising at least one substrate, wherein said multilayer stack having an outermost and innermost layer, wherein at least one said substrate is said outermost layer and/or at least one said substrate is said inner most layer.

16. The film or coating according to claim 13, wherein said multilayer stack comprises alternating layer of substantially pure magnesium fluoride and substantially pure germanium.

17. The film or coating according to claim 12, wherein said at least one first material and at least one second material with different refractive indices are crystalline.

* * * * *